United States Patent [19]

Osada et al.

[11] 4,325,074

[45] Apr. 13, 1982

[54] SEMICONDUCTOR SWITCHING DEVICE

[75] Inventors: Yoshihide Osada; Syuji Sugioka, both of Yokohama, Japan

[73] Assignee: Tokyo Shibaura Electric Co., Ltd., Japan

[21] Appl. No.: 92,727

[22] Filed: Nov. 9, 1979

Related U.S. Application Data

[63] Continuation-in-part of Ser. No. 837,271, Sep. 27, 1977, abandoned.

[30] Foreign Application Priority Data

Sep. 28, 1976 [JP] Japan .............................. 51-115406

[51] Int. Cl.³ .......................................... H01L 29/74
[52] U.S. Cl. ...................................... 357/37; 357/13; 357/38; 357/39; 357/90
[58] Field of Search ...................... 357/37, 38, 39, 89, 357/90, 20, 13

[56] References Cited

U.S. PATENT DOCUMENTS 2,993,154  7/1961  Goldey et al. .................... 357/38
4,112,458  9/1978  Jaskolski et al. .................. 357/38

*Primary Examiner*—William D. Larkins
*Attorney, Agent, or Firm*—Finnegan, Henderson, Farabow, Garrett & Dunner

[57] ABSTRACT

Provided is a semiconductor switching device having a four-layer structure. A second semiconductor layer of the switching device has a depth of 8μ. The thickness of the second semiconductor layer is set at a value less than a value four times the thickness of a depletion layer which is formed in the second semiconductor layer when breakover voltage has been applied to the switching device.

4 Claims, 8 Drawing Figures

SEMICONDUCTOR SWITCHING DEVICE

CROSS REFERENCE TO THE RELATED APPLICATION

This is a continuation-in-part application of U.S. patent application Ser. No. 837,271 filed on Sept. 27, 1977, now abandoned.

BACKGROUND OF THE INVENTION

This invention relates to a semiconductor switching device.

Conventionally, a compact four-layer diode or silicon symmetrical switch is employed for a triggering circuit for use in a fluorescent lamp, an igniting circuit for application to as gas lighter or gas appliance, etc. Such diode or switch is so designed as to attain a constant breakover voltage $V_B$, a large holding current $I_H$, and a small breakover current $I_B$ flowing upon application of the breakover voltage $V_B$.

An example of such type of silicon symmetrical switch is shown in cross-section in FIG. 1. This switch includes an n conductivity type layer 1, and n conductivity type layer 2, a p conductivity type intermediate layer 3, an n conductivity type intermediate layer 4, and a p conductivity type intermediate layer 5. The n conductivity type intermediate layer 4 is so formed as to have a thickness of approximately 95$\mu$, while each of the p conductivity type intermediate layers 3 and 5 is so formed as to have a thickness of approximately 15$\mu$. Further, these p conductivity type intermediate layers 3 and 5 are each so formed as to have a maximum impurity concentration of about $4 \times 10^{17}$ atoms/cm$^3$ at the proximity of the respective junction faces with the n conductivity type layers 1 and 2.

FIG. 2 shows the profile of impurity diffusion in the layers 1 to 3 of the switch shown in FIG. 1. In this Figure, on the ordinate is plotted the impurity concentration (atoms/cm$^3$) of each layer, while on the abscissa is plotted the depth ($\mu$) of impurity diffusion in each layer as measured from the upper surface of the layer 1.

As seen from FIG. 1, the silicon symmetrical switch may control current flow in both directions, or in forward and reverse directions with substantially the same electrical characteristics. Table 1 below shows the electrical characteristics of each of ten samples of the switch both forward and reverse directions.

TABLE 1

| Switch No. | Forward $V_B$(V) | Reverse $V_B$(V) | Forward $I_B$ ($\mu$A) | Reverse $I_B$ ($\mu$A) | Forward $I_H$ (mA) | Reverse $I_H$ (mA) |
|---|---|---|---|---|---|---|
| 1 | 116 | 115 | 5 | 5 | 80 | 80 |
| 2 | 112 | 112 | 3 | 3 | 69 | 65 |
| 3 | 119 | 119 | 1 | 1 | 30 | 24 |
| 4 | 115 | 116 | 1 | 1 | 30 | 20 |
| 5 | 115 | 115 | 2 | 2 | 65 | 65 |
| 6 | 110 | 118 | 1 | 1 | 66 | 70 |
| 7 | 112 | 115 | 2 | 2 | 69 | 59 |
| 8 | 110 | 112 | 8 | 8 | 81 | 79 |
| 9 | 115 | 115 | 2 | 2 | 23 | 23 |
| 10 | 110 | 112 | 2 | 2 | 52 | 48 |

As seen from the above Table 1, in the silicon symmetrical switch shown in FIG. 1 the holding current $I_H$ can be kept as relatively large as 20 to 80 mA and yet as compared with this holding current the breakover current $I_B$ allowed to flow into the switch upon application of the breakover voltage thereof can be chosen to be as appreciably small as 1 to 80 $\mu$A. This is one of the big merits. However, where it is desired to enhance the responsive characteristics of the switch, the breakover current $I_B$ is required to be further reduced to a value equal to or less than, for example, 0.1 $\mu$A.

SUMMARY OF THE INVENTION

Accordingly, the object of the invention is to provide a semiconductor switching device which is improved in its electrical characteristics by utilizing Early effect.

According to an embodiment of the invention, there is provided a semiconductor switching device which comprises a substrate of one conductivity type, a first semiconductor region of the opposite conductivity type formed with a depth not larger than 10$\mu$ in a first surface region of said substrate, a second semiconductor region of said one conductivity type formed in said first semiconductor region to provide a planar structure, and a third semiconductor region of said opposite conductivity type provided on a second surface region of said substrate, said switching device being turned on upon application of breakover voltage in which while said breakover voltage is being applied to said switching device at least that portion of said first semiconductor region which lies between said substrate and said second semiconductor region has an effective thickness reduced to a value 0.50 to 0.75 times that of said portion given in the case where no voltage is applied to said switching device.

BREIF DESCRIPTION OF THE DRAWING

Figure 3:
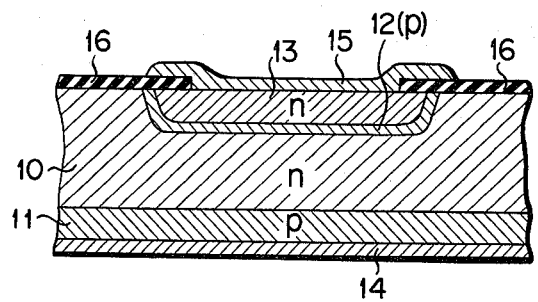
FIG. 3 is a sectional view of a semiconductor switching device according to an embodiment of the invention.
Figure 4:
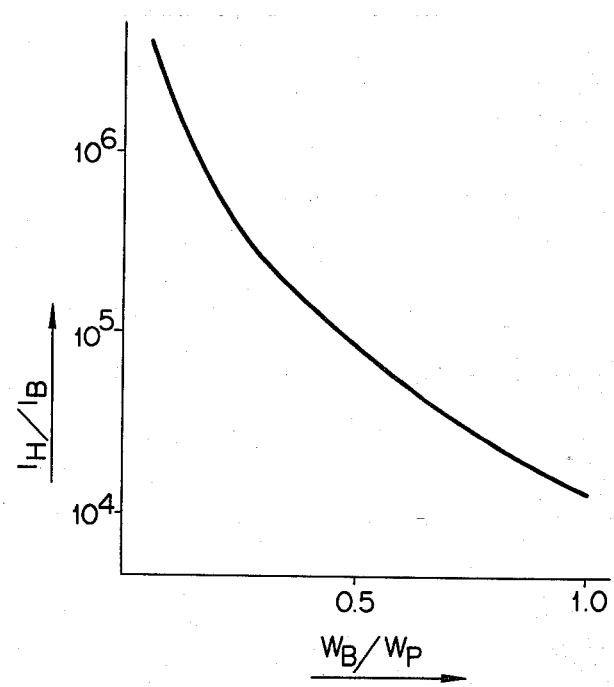
Figure 5:
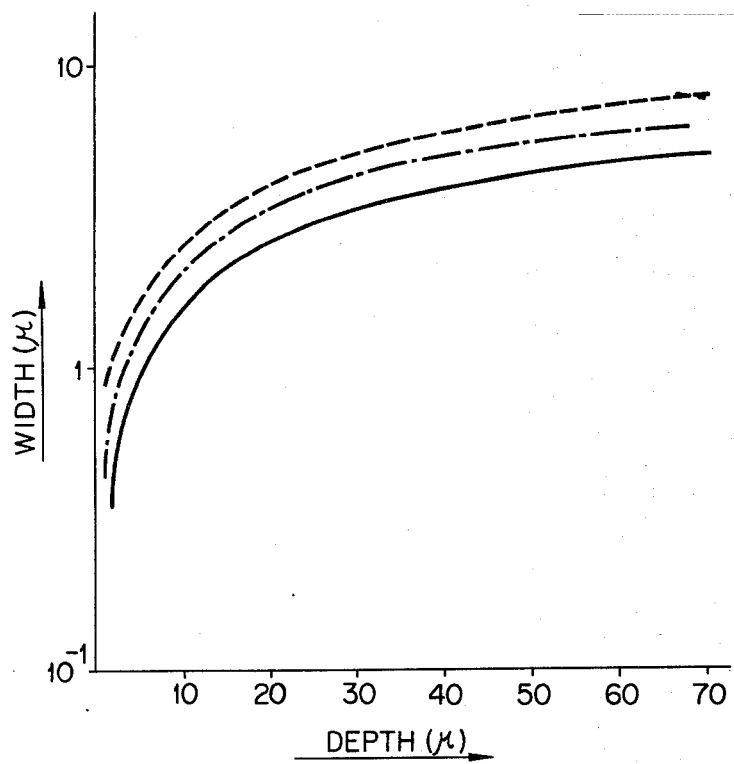
Figure 6:
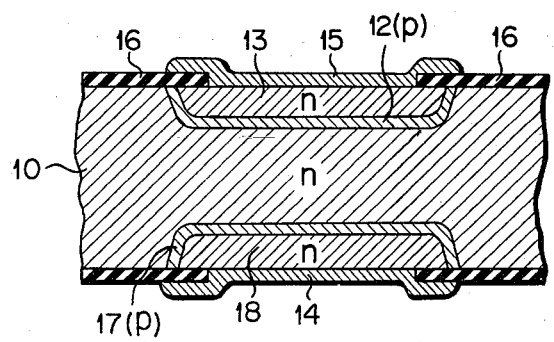
Figure 7:
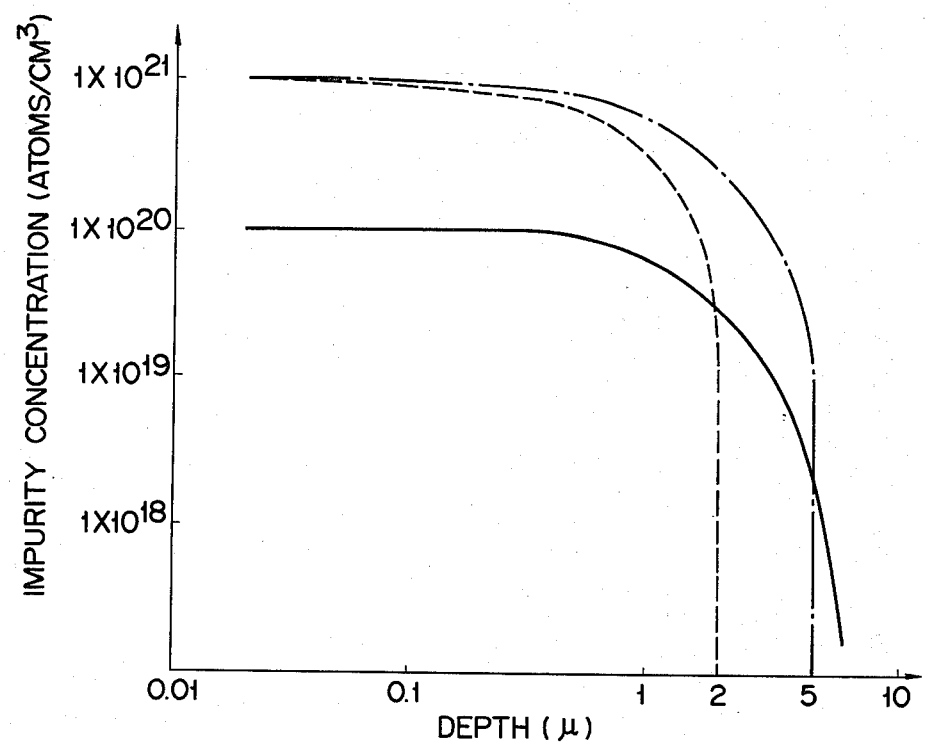
Figure 8:
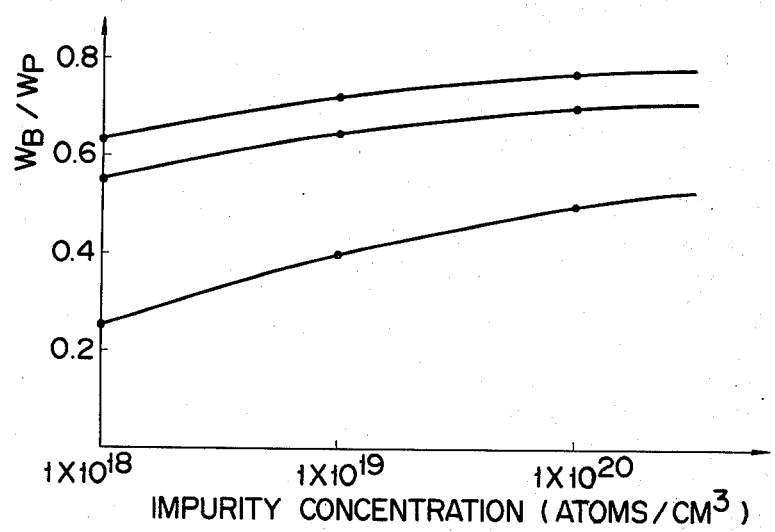

FIG. 4 graphically shows the relation of the Early effect obtained in the switching device shown in FIG. 3 with the breakover current flowing upon application of the breakover voltage to the switching device and the holding current in the same;

FIG. 5 graphically shows the relation between the depth of a p type region of the switching device shown in FIG. 3 and the width of a depletion layer formed in this p type region when a voltage has been applied thereto;

FIG. 6 is a sectional view of a semiconductor switching device according to another embodiment of the invention, in which switching functions can be obtained in both forward and reverse directions;

FIG. 7 shows profiles of impurity concentrations of the p type and n type regions of the switching device; and FIG. 8 shows the relation between the Early effect obtained in the switching device and the surface impurity concentration of the p type region of the switching device shown in FIG. 3.

DETAILED DESCRIPTION OF THE PREFERRED EMBODIMENTS

FIG. 3 shows a cross-section of a thyristor accordinto to an embodiment of the invention. On the surface of an n type substrate 10 having an impurity concentration of, for example, $4.5 \times 10^{15}$ atoms/cm$^3$ is formed a p type layer or anode layer 11. In the surface region of the n type substrate 10 opposite to the p type layer 11 is formed a p type region 12 so as to permit the same to have a depth of, for example, 8μ. In this p type region 12 is formed an n type region or cathode layer 13 so as to permit the same to have the maximum impurity concentration of, for example, $1 \times 10^{21}$ atoms/cm$^3$ and have a depth of, for example, 2 to 5μ, thus providing a planar structure. Owing to the planar structure having the shallow p type region 12, the thyristor in FIG. 3 will start to be triggered at a lower curved portion. The region 12 may be formed by diffusing proper impurities from an impurity source under a condition that the impurity concentration of the impurity source is kept constant at, for example, $1 \times 10^{20}$ atoms/cm$^3$. FIG. 7 shows the relationship between the impurity concentrations of the p type and n type regions 12 and 13 and the diffusion depth of these regions 12 and 13. In FIG. 7, a solid line indicates the case where p type impurities are diffused from the surface to the depth of about 7μ under the condition that the impurity concentration of the p type impurity source is kept at $1 \times 10^{20}$ atoms/cm$^3$, and broken and dash-dot lines respectively indicate the case where n type impurities are diffused from the surface to the depth of 2μ and 5μ under the condition that the impurity concentration of the n type impurity source is kept at $1 \times 10^{21}$ atoms/cm$^3$.

An anode electrode 14 and cathode electrode 15 are provided on the anode layer 11 and cathode layer 13, respectively.

In this embodiment, the substrate 10 is designed to have a specific resistance of 1 to 2 Ω·cm in order to set the breakover voltage $V_B$ for the thyristor at approximately 100 volts. In the case of turning on the thyristor by applying a forward voltage thereto, a depletion layer produced at the p type region 12 immediately before the thyristor has been turned on becomes approximately 1.5μ wide, and the effective width of the p type region 12 becomes 1.5 to 4.5μ, which is approximately 50 to 75% of the width thereof in the case where no voltage is applied to the thyristor. Where the ratio $W_B/W_p$ of the effective width $W_B$ of the p type region at the time when a breakover voltage is applied to the thyristor to the effective width $W_p$ of the p type region at the time when no voltage is applied to the thyristor, is small, the thyristor or switching element has good turn-on sensitivity. As a result, it is possible to make small a current $I_B$ which passes through the switching element immediately before the same is turned on. In this embodiment, in order to attain a reliable and high-speed switching operation, the efficiency $\beta$ of transferring minority carriers from the cathode layer 13 into the substrate 10 is increased by decreasing the width of the p type region 12, and the resulting increment of the current amplification α is offset by causing a decrease in the efficiency γ of injecting carriers from the cathode layer 13 into the p type region 12 by increasing the surface concentration of the p type region 12.

It is generally known in the art that the ratio $W_B/W_p$ will be increased when the surface concentration of p type region 12 is increased as shown in FIG. 8. In FIG. 8, the impurity concentration of the n type substrate 10 is $4.5 \times 10^{15}$ atoms/cm$^3$ and the diffusion depth of the n type region 13 is 4μ, and solid, broken and dash-dot lines respectively indicate the cases where the diffusion depth of the p type region 12 is set at 10μ, 8μ and 6μ. As is clearly seen from FIG. 8, increase in the ratio $W_B/W_p$ by increasing the surface impurity concentration of the p type region 12 can be sufficiently compensated for by properly changing the relationship between the diffusion depths of the p type region 12 and the n type region 13, so that the radio $W_B/W_p$ can be made equal to or less than 0.75.

The following relation is established for the current amplification α, carrier transfer efficiency $\beta$ and carrier injection efficiency γ.

$$\alpha \approx \gamma \cdot \beta \qquad \ldots (1)$$

The carrier injection efficiency γ with which carriers are injected from the cathode layer 13 into the p type region 12 is given by the following equation.

$$\gamma = \frac{I_N}{I_A} = \left[ 1 + \frac{\sigma_P \cdot W_P}{\sigma_N \cdot L_P} \right]^{-1} \qquad (2)$$

where $I_A$ represents the total current passing through the switching element, $I_N$ current resulting from the flow of electrons, $\sigma_N$ the conductivity of the cathode layer 13, $\sigma_p$ the conductivity of the p type region 12, $L_P$ represents the average length of diffusion of the cathode layer 13 over which positive holes are diffused and is expressed by the formula $L_p = [D_p \cdot \tau_p]^{\frac{1}{2}}$ ($D_p$ represents the diffusion coefficient of holes in silicon and $\tau_p$ the life time of the hole).

As apparent from the above equation (2), the carrier injection efficiency γ can be decreased by increasing the impurity concentration of the p type region 12 and making the conductivity $\sigma_p$ of the p type region large.

Further, the carrier transfer efficiency $\beta$ with which carriers are transferred from the n type region 13 into the substrate 10 is given by the following equation.

$$\beta \approx \mathrm{sech}\, W_B/L_n \qquad \ldots (3)$$

where $W_B$ represents the thickness of the p base region and $L_n$ the average length of diffusion of the p type region 12 over which electrons are diffused and is expressed by the formula $L_n = [D_n \cdot \tau_n]^{\frac{1}{2}}$ ($D_n$ represents the diffusion coefficient of electrons in silicon and $\tau_n$ the life time of the electron).

As apparent from the above equation (3), the carrier transfer efficiency $\beta$ can be increased by decreasing the thickness $W_B$ of the p type region 12 or by increasing the average length $L_n$ of diffusion of the P type region.

The thyristor is turned on when $\alpha_p + \alpha_n = 1$ where $\alpha_p$ represents the current amplification of the current amplification section comprised of the cathode layer 13, p type region 12 and substrate 10 and $\alpha_n$ the current amplification of the current amplification section comprised of the p type region 12, substrate 10 and anode layer 11. Where it is desired that the holding current of the thyristor be chosen to have a large value, the current amplification $\alpha_n$ is preferably set to 0.4 or less. Further, the substrate 10, in order to prevent the cracking of the wafer, is fabricated to a thickness of, for example, 150μ or more. In the thyristor having a withstand voltage of approximately 100 volts, the current amplification $\alpha_n$ is almost free from the Early effect and is kept constant.

In a condition in which any current is kept interrupted from passing through the thyristor, i.e., in which no breakover voltage is applied to the thyristor, the current amplification $\alpha_p$ is set at a value smaller than $(1 - \alpha_n)$. When applying a forward voltage between the anode and cathode electrodes 14, 15 of the thyristor shown in FIG. 3, a minute amount of current flows in the thyristor. As this minute amount of current increases, the current amplification $\alpha_p$ increases. When breakover voltage is applied between the anode and cathode electrodes 14, 15 the minute amount of current comes to have a specified value, resulting in that $\alpha_n + \alpha_p = 1$. Consequently, this thyristor is turned on.

Where the p type region of the thyristor has little Early effect, the amount of current flowing into the thyristor immediately before the same is turned on is substantially equal to the amount of current having flowed through the thyristor immediately before the thyristor is turned off. Actually, however, Early effect is produced in the p type region 12, so that the effective thickness of the p type region 12 at the turn-on of the thyristor is different from that at the turn-off of the thyristor. Therefore, the amount of current flowing into the thyristor immediately before the same is turned on becomes smaller than the amount of current having flowed through the thyristor immediately before the thyristor is turned off. That is, when causing a gradual increase in level of the forward voltage between the anode and cathode electrodes 14, 15 in order to make the thyristor conductive, the p type region 12 has an increased Early effect to have a wider depletion layer and accordingly has a smaller effective thickness. On the other hand, when it is desired to keep the thyristor conductive, the thyristor is required to have a large holding current because only an extremely low voltage is being applied between the anode and cathode electrodes and accordingly the p type region 12 has a large effective thickness. By utilizing the Early effect in the above-mentioned manner it becomes possible to set at a sufficiently small value the amount of current $I_B$ flowing into the thyristor upon the turn-on thereof and simultaneously to set at a sufficiently large value the ratio $I_H/I_B$ between the current $I_B$ and the holding current $I_H$ for the thyristor.

FIG. 4 shows the relation between the Early effect and the ratio $I_H/I_B$. In this Figure, the abscissa represents the degree of Early effect or the ratio $W_B/W_p$ between the thickness $W_p$ of the p type region 12 at the time when substantially no voltage is applied between the anode and cathode electrodes 14 and 15 and the effective length $W_B$ thereof at the time when breakover voltage is applied between the anode and cathode electrodes 14, 15, while the ordinate represents the ratio $I_H/I_B$ of the holding current $I_H$ to the breakover current $I_B$. Where it is desired to obtain a good and reliable switching element, it is necessary that the ratio $I_H/I_B$ be chosen to have a value of about $0.5 \times 10^5$ or more, and therefore that the ratio $W_B/W_p$ be chosen to have a value of about 0.75 or less.

In order to prepare a thyristor having a withstand voltage of 100 volts, the substrate 10 was arranged to have a specific resistance of 1 to 2 Ω·cm. In this example, a breakover voltage of approximately 100 volts was applied between the anode and cathode electrodes of the thyristor. FIG. 5 shows a change in Early effect of the specified p type region occurring when the breakover voltage is applied to the thyristor. In FIG. 5, the abscissa represents the depth ($\mu$) of the specified p type region from the surface, while the ordinate represents the width ($\mu$) of a depletion layer produced in the specified p type region. Note that the solid line, dash-dot line and broken line in FIG. 5 indicate the changes in Early effect in the case where the surface concentration of the specified p type region is $10^{20}$ atoms/cm$^3$, $10^{19}$ atoms/cm$^3$ and $10^{18}$ atoms/cm$^3$, respectively. Usually, in order to make it easy to carry out the diffusion process, the p type region of a small sized thyristor is chosen to have a thickness of 50$\mu$ or less. Accordingly, the depletion layer of the p type region has a width of approximately 5 to 6$\mu$ or less. Therefore, when the thickness of the p type region is set at a value of 10$\mu$ or less, the above-mentioned ratio $W_B/W_p$ can be conveniently set to 0.50 to 0.75.

Where in the thyristor having such construction as shown in FIG. 3 the p type region 12 is designed to have a thickness of 10$\mu$ or less as above described, the thyristor indeed has an improved sensitivity owing to the above-mentioned Early effect and the planar structure having the shallow p type region 12.

In the thyristor shown in FIG. 3, the width of the p type region 12 is set at 8$\mu$, the width of the cathode layer 13 is set at about 3$\mu$, the surface impurity concentration of the p type region 12 is set at a value of $1 \times 10^{20}$ atoms/cm$^3$; the maximum impurity concentration of the p type region 12 below the cathode layer 13 is set at $2.5 \times 10^{19}$ atoms/cm$^3$; the surface impurity concentration of the n type region 13 is $1 \times 10^{21}$ atoms/cm$^3$; the thickness of the substrate 10 is set at a value of 90 to 230$\mu$, for example, 150$\mu$; and the impurity concentration of the substrate 10 is $4.5 \times 10^{15}$ atoms/cm$^3$. In this thyristor, where breakover voltage is applied thereto, the depletion layer produced in the substrate 10 has a width of approximately 10$\mu$. Therefore, even when the thickness of the substrate 10 is set at a value of 90$\mu$, the effective thickness thereof becomes 80$\mu$, which corresponds to approximately 90% of the thickness of the substrate 10 given in the case where no bias voltage is applied to the thyristor. Accordingly, the substrate 10 has only a small Early effect. This means that the Early effect of the substrate 10 only slightly influences the electrical characteristics of the thyristor.

Table 2 below shows the electrical characteristics of ten samples of the thyristor shown in FIG. 3.

TABLE 2

| Switching Elements' Nos. | $V_B(V)$ | $I_B(\mu A)$ | $I_H(mA)$ |
| --- | --- | --- | --- |
| 1 | 106 | 0.07 | 40 |
| 2 | 106 | 0.07 | 45 |
| 3 | 107 | 0.06 | 35 |
| 4 | 104 | 0.07 | 45 |
| 5 | 104 | 0.06 | 30 |
| 6 | 104 | 0.06 | 30 |
| 7 | 104 | 0.08 | 50 |
| 8 | 104 | 0.08 | 55 |
| 9 | 105 | 0.07 | 42 |
| 10 | 107 | 0.06 | 35 |

Figure 1:
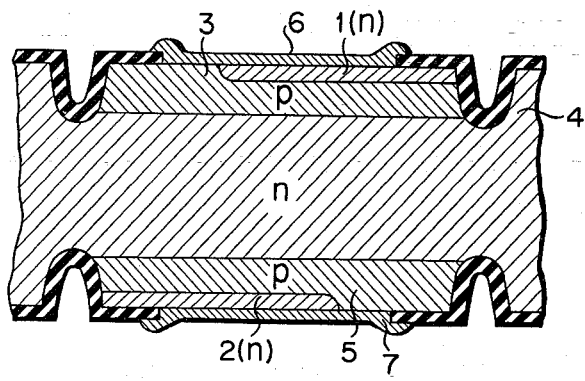
FIG. 1 is a sectional view of a conventional silicon symmetrical switching device.
Figure 2:
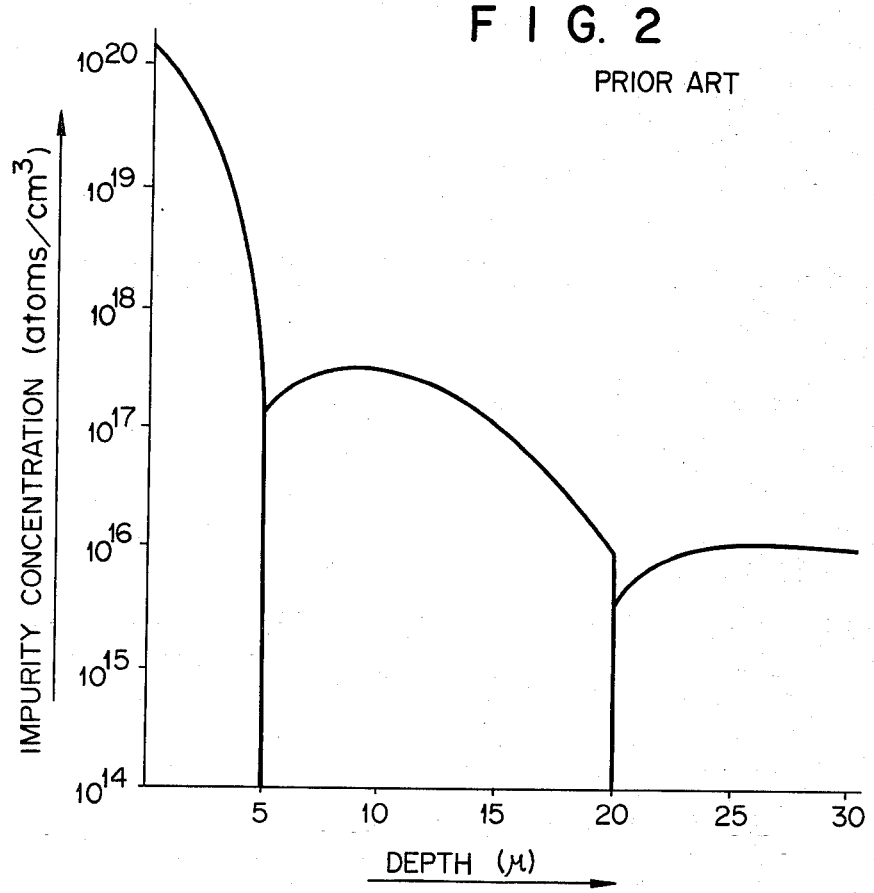
FIG. 2 shows the profile of impurity diffusion in each semiconductor layer of the switching device shown in FIG. 1.

As apparent from the above Table 2, in the thyristor shown in FIG. 3 the current $I_B$ which flows in the thyristor upon the breakover thereof is suppressed to a value of 0.1 $\mu A$ or less, whereby the responsive characteristics of the thyristor is improved. The breakover voltage $V_B$ can be set at an appropriate value by varying the specific resistance of the substrate 10. In this thyristor the holding current $I_H$ thereof is kept slightly small as compared with that in the silicon symmetrical switch shown in FIG. 1. However, in case of a switching device for use in, for example, a lighting circuit or igniting circuit, if only such device has a holding current of 10 mA or more, it will well serve the purpose. Where the thyristor is desired to have an increased amount of holding current under the condition wherein the current $I_B$ in the thyristor at the breakover thereof is kept small, the thickness of the substrate 10 has only to be made large with the thickness of the p type region 12 kept fixed, or the life time of carriers in the p type region has only to be decreased by diffusing metal such as gold into the p type region, or the impurity concentration of the p type region 12 has only to be increased. Further, from various experiments, it has been understood that the maximum impurity concentration of the p type region 12 is preferably set at a value not less than $8 \times 10^{17}$ atoms/cm$^3$.

In the thyristor shown in FIG. 3, an oxide layer 16 is provided on the peripheral edge portion of the cathode layer 13 in such a manner as to cover the entire region of the peripheral edge portion. The depletion layer produced between the p type region 12 and the substrate 10 takes a shape becoming narrower toward the proximity of the upper surface region of the substrate 10. The provision of the oxide layer 16 is for the purpose of preventing an initial trigger operation from commencing at the proximity of the upper surface region of the substrate 10, ensuring that initial trigger operation commences at the lower curved portion of the regions 12 and 13.

FIG. 6 shows a thyristor according to another embodiment of the invention. This thyristor has a p type region 17 and n type region or anode layer 18 formed symmetrical with the p type region 12 and cathode layer 13, respectively. Each semiconductor region in this thyristor has the same dimension and impurity concentration as a corresponding semiconductor region of the thyristor shown in FIG. 3. This thyristor has substantially the same electrical characteristics in forward and reverse directions. That is, in this thyristor, even when bias voltage is applied thereto in the reverse direction, small breakover current $I_B$ and sufficiently large holding current $I_H$ will flow in the reverse direction.

What we claim is:

1. A semiconductor switching device comprising:
   a substrate of one conductivity type;
   a first semiconductor region of the opposite conductivity type formed in a first surface region of said substrate to provide a planar structure, said first semiconductor region having a depth of not more than 10 microns and a surface concentration of $10^{20}$;
   a second semiconductor region of said one conductivity type formed in said first semiconductor region to provide a planar structure, said second semiconductor region having a depth of not more than 5 microns and a surface concentration greater than said surface concentration of said first semiconductor region; and
   a third semiconductor region of said opposite conductivity type provided on a second surface region of said substrate.

2. A semiconductor switching device according to claim 1 in which said one conductivity type is an n conductivity type.

3. A semiconductor switching device according to claim 1 which further comprises an insulating layer provided to cover said first semiconductor region and said second semiconductor region at that portion which is located adjacent to said first semiconductor region.

4. A semiconductor switching device according to claim 1 in which said second semiconductor region has a thickness of 2 to 5$\mu$.

* * * * *